United States Patent
Li

(10) Patent No.: US 10,698,547 B2
(45) Date of Patent: Jun. 30, 2020

(54) TOUCH PANEL AND ORGANIC LIGHT EMITTING DIODE DISPLAY PANEL

(71) Applicant: Wuhan China Star Optoelectronics Semiconductor Display Technology Co., Ltd., Wuhan, Hubei (CN)

(72) Inventor: Bo Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/230,855

(22) Filed: Dec. 21, 2018

(65) Prior Publication Data

US 2020/0042116 A1 Feb. 6, 2020

Related U.S. Application Data

(63) Continuation of application No. PCT/CN2018/105637, filed on Sep. 14, 2018.

(30) Foreign Application Priority Data

Aug. 6, 2018 (CN) .......................... 2018 1 0883764

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 27/323* (2013.01);
(Continued)

(58) Field of Classification Search
CPC ...... G06F 3/044; G06F 3/0443; G06F 3/0444; G06F 3/0445; G06F 3/0446;
(Continued)

(56) References Cited

U.S. PATENT DOCUMENTS

2012/0306797 A1* 12/2012 Misaki .................. G06F 3/0412
345/173
2014/0313434 A1* 10/2014 Kim ..................... G02F 1/13338
349/12

(Continued)

FOREIGN PATENT DOCUMENTS

CN    103777810 A    5/2014
CN    108054193 A    5/2018

*Primary Examiner* — Tom V Sheng
(74) *Attorney, Agent, or Firm* — Leong C. Lei

(57) ABSTRACT

Disclosed is a touch panel and a corresponding organic light emitting diode display panel. A metal grid touch line is fabricated on an encapsulation layer of a flexible organic light emitting diode display panel, and is not positioned in a light emitting area of a pixel point, and traced in a middle of adjacent pixel points. At least one electrode of a driving electrode and a sensing electrode is conducted with a metal bridge thereunder, and a floating electrode is disposed in the driving electrode or the sensing electrode to realize a flexible touch panel, to reduce a thickness of a film by reducing use of transparent optical adhesive and improve a touch effect.

18 Claims, 7 Drawing Sheets

(51) Int. Cl.
*H01L 27/32* (2006.01)
*H01L 51/52* (2006.01)

(52) U.S. Cl.
CPC .................. *H01L 51/5253* (2013.01); *G06F 2203/04102* (2013.01); *G06F 2203/04111* (2013.01); *H01L 2251/5338* (2013.01)

(58) Field of Classification Search
CPC ......... G06F 3/0412; G06F 2203/04102; G06F 2203/04111; H01L 27/323; H01L 51/5253; H01L 2251/5338
See application file for complete search history.

(56) References Cited

U.S. PATENT DOCUMENTS

| | | | |
|---|---|---|---|
| 2015/0049260 A1* | 2/2015 | Yashiro | G06F 3/044 349/12 |
| 2016/0111328 A1* | 4/2016 | Mei | G06F 3/044 257/786 |
| 2016/0342256 A1* | 11/2016 | Zhou | G06F 3/0412 |
| 2016/0377939 A1* | 12/2016 | Yang | G02F 1/292 345/174 |
| 2018/0059843 A1* | 3/2018 | Kim | G06F 3/044 |
| 2018/0095577 A1* | 4/2018 | Han | G06F 3/0412 |
| 2018/0239493 A1* | 8/2018 | Khazeni | G06F 3/0418 |
| 2018/0299990 A1* | 10/2018 | Chiang | G06F 3/0412 |
| 2019/0121474 A1* | 4/2019 | Lee | G09G 3/3291 |
| 2019/0146608 A1* | 5/2019 | Lee | G06F 3/044 345/174 |
| 2019/0220114 A1* | 7/2019 | Shu | G06F 3/0446 |
| 2019/0302934 A1* | 10/2019 | Rhe | G06F 3/047 |
| 2019/0302943 A1* | 10/2019 | Rhe | G06F 3/0446 |
| 2019/0302944 A1* | 10/2019 | Rhe | G06F 3/04164 |
| 2019/0310731 A1* | 10/2019 | Rhe | G06F 3/0446 |
| 2019/0324575 A1* | 10/2019 | Ye | G06F 3/044 |
| 2019/0339818 A1* | 11/2019 | Rhe | G06F 3/0446 |

\* cited by examiner

TOUCH PANEL AND ORGANIC LIGHT EMITTING DIODE DISPLAY PANEL

CROSS-REFERENCE TO RELATED APPLICATION

This application is a continuing application of PCT Patent Application No. PCT/CN2018/105637 entitled "Touch panel and organic light emitting diode display panel", filed on Sep. 14, 2018, which claims priority to Chinese Patent Application No. 201810883764.8, filed on Aug. 6, 2018, both of which are hereby incorporated in its entireties by reference.

FIELD OF THE INVENTION

The present invention relates to a display technology field, and more particularly to a metal grid touch panel and an organic light emitting diode display panel.

BACKGROUND OF THE INVENTION

In recent years, the rapid development of active matrix organic light emitting diode display (AMOLED) technology has promoted the rapid entry of curved surface and flexible display touch products into the market, and respective panel manufacturers have invested in flexible display touch projects. At present, the touch technology with the AMOLED display panel mainly has an external touch film (Film) bonding solution and a glass packaged rigid On-Cell technology (it means embedding the touch panel between the color filter substrate and the polarizer of the display panel). Either in the external film or the glass On-Cell touch technology, there is a thickness increasing problem of the product which affects the narrow frame design.

FIG. 1 shows a structural diagram of an organic light emitting diode display panel using an external touch film bonding solution in the prior art. The OLED display panel includes: a substrate 1', an OLED layer 2', a packaged layer 3', a first transparent optical adhesive layer 4', a touch thin film layer 5', a polarizer 6', a second transparent optical adhesive layer 7' and a cover plate glass layer 8' from bottom to top in sequence. The transparent optical adhesive bonds the touch film and the OLED layer, and meanwhile, the polarizer and the cover plate glass are bonded with the transparent optical adhesive. Since the bonding times are twice, and the bonding tolerance is generally 0.1 mm or more. The external touch film bonding solution increases the thickness of the product and is not beneficial to the narrow frame design products.

FIG. 2 shows a structural diagram of an organic light emitting diode display panel using a glass packaged On-Cell touch technology in the prior art. In the figure, the OLED display panel includes: a substrate 10', and OLED layer 20', a packaged glass layer 30', a touch control line layer 40', a polarizer 50', a transparent optical adhesive layer 60' and a cover plate glass layer 70'. The touch sensing line is fabricated on the packaged glass of the display panel. Then, the surface with the packaged glass is attached with the OLED panel with the transparent optical adhesive without separately attaching the external touch film. However, this structure is only suitable for the production of rigid AMOLED display panels, and the overall thickness of the product is thick, which is not suitable for the development direction of the current product being light and thin and flexible.

SUMMARY OF THE INVENTION

An objective of the present invention is to provide a touch panel and an organic light emitting diode display panel, which can realize a flexible touch panel, reduce a thickness of the organic light emitting diode display panel and improve a touch control effect.

For solving the aforesaid issue, the embodiment of the present invention provides a touch panel, comprising:

a plurality of first touch electrode strings arranged in a first direction, wherein each of the first touch electrode strings comprises a plurality of first grid electrodes which are electrically connected; each of the first grid electrodes at least comprises a plurality of first metal grid bars spaced and connected, and a first floating electrode is disposed between adjacent two first metal grid bars;

a plurality of second touch electrode strings in a same layer that intersect with the plurality of first touch electrode strings arranged in a second direction, wherein each of the second touch electrode strings comprises a plurality of second grid electrodes; each of the second grid electrodes comprises a plurality of second metal grid bars spaced and connected, and a second floating electrode is disposed between adjacent two second metal grid bars;

an insulating layer, disposed between a metal bridge and the first grid electrode, the second grid electrode to insulate the plurality of first touch electrode strings and the plurality of second touch electrode strings.

Adjacent edges of the first grid electrode and the second grid electrode are staggered, and electrical separations between the first metal grid bar and the adjacent second metal grid bar, between the first metal grid bar and the adjacent first floating electrode and between the second metal grid bar and the adjacent second floating electrode are achieved by slight breaks therebetween.

Two ends of the metal bridge are connected with two adjacent second grid electrodes with through holes provided in the insulating layer.

The metal bridge further connects the second grid electrode and the first floating electrode of the first grid electrode adjacent to the second grid electrode with a through hole disposed in the insulating layer.

Staggered edges of the first touch electrode string and the second touch electrode string possess a pulsed edge or a zigzag edge.

The first metal grid bar and the second metal grid bar are made of titanium aluminum titanium three-layer composite metal, and the metal bridge is made of titanium aluminum titanium three-layer composite metal or molybdenum aluminum molybdenum three-layer composite metal.

The metal bridge is a metal grid bridge, and the metal bridge comprises at least one third metal line, which is electrically connected, and the metal bridge formed by the third metal line is linear, X-shaped or double X-shaped as a whole.

The first touch electrode string is one of a driving electrode and a sensing electrode, and the second touch electrode string is an other of the driving electrode and the sensing electrode.

Widths of the first metal grid bar, the second metal grid bar and the third metal line in the metal bridge are within a range of 0.5 μm to 5 μm.

A diameter of the through hole does not exceed a distance of adjacent pixel points.

A distance of the slight breaks is within a range of 3 μm to 20 μm.

Correspondingly, the present invention also provides an organic light emitting diode display panel, which comprises a substrate, an organic light emitting diode layer disposed on the substrate and an encapsulation layer disposed above the organic light emitting diode layer, further comprising:

a substrate layer disposed on the encapsulation layer;
a touch panel disposed on the substrate layer;
a protective layer disposed on the touch panel;
wherein the touch panel comprises:
a plurality of first touch electrode strings arranged in a first direction, wherein each of the first touch electrode strings comprises a plurality of first grid electrodes which are electrically connected; each of the first grid electrodes at least comprises a plurality of first metal grid bars spaced and connected, and a first floating electrode is disposed between adjacent two first metal grid bars;
a plurality of second touch electrode strings in a same layer that intersect with the plurality of first touch electrode strings arranged in a second direction, wherein each of the second touch electrode strings comprises a plurality of second grid electrodes; each of the second grid electrodes comprises a plurality of second metal grid bars spaced and connected, and a second floating electrode is disposed between adjacent two second metal grid bars;
an insulating layer, disposed between a metal bridge and the first grid electrode, the second grid electrode to insulate the plurality of first touch electrode strings and the plurality of second touch electrode strings.

Adjacent edges of the first grid electrode and the second grid electrode are staggered, and electrical separations between the first metal grid bar and the adjacent second metal grid bar, between the first metal grid bar and the adjacent first floating electrode and between the second metal grid bar and the adjacent second floating electrode are achieved by slight breaks therebetween.

Two ends of the metal bridge are connected with two adjacent second grid electrodes with through holes provided in the insulating layer.

The metal bridge further connects the second grid electrode and the first floating electrode of the first grid electrode adjacent to the second grid electrode with a through hole disposed in the insulating layer.

Staggered edges of the first touch electrode string and the second touch electrode string possess a pulsed edge or a zigzag edge.

The first metal grid bar and the second metal grid bar are made of titanium aluminum titanium three-layer composite metal, and the metal bridge is made of titanium aluminum titanium three-layer composite metal or molybdenum aluminum molybdenum three-layer composite metal.

The metal bridge is a metal grid bridge, and the metal bridge comprises at least one third metal line, which is electrically connected, and the metal bridge formed by the third metal line is linear, X-shaped or double X-shaped as a whole.

The first touch electrode string is one of a driving electrode and a sensing electrode, and the second touch electrode string is an other of the driving electrode and the sensing electrode.

Widths of the first metal grid bar, the second metal grid bar and the third metal line in the metal bridge are within a range of 0.5 μm to 5 μm.

A diameter of the through hole does not exceed a distance of adjacent pixel points.

A distance of the slight breaks is within a range of 3 μm to 20 μm.

With implementing the embodiments of the present invention, the benefits are:
the touch panel and the organic light emitting diode display panel provided by the present invention can realize the On-Cell touch scheme of the flexible display touch control by forming the metal grid touch sensing line on the thin film encapsulation layer of the flexible organic light emitting diode display panel;

moreover, since the metal grid is used as the touch sensing circuit, the product can possess good bending resistance characteristics, and the metal grid lines are traced in the middle of adjacent pixel points, thereby minimizing the optical influence of the touch sensor on the organic light emitting diode;

meanwhile, a structure of the metal grid bar and the floating electrode is used in both the first touch electrode and the second touch electrode, and in the meantime, the floating electrodes at the edges in the second touch electrode and the first touch electrode are connected with the metal bridge, which can increase a contact area between the first touch electrode and the second touch electrode to enhance a mutual capacitance signal for effectively reducing the influence of the interference signal and improving the sensitivity of the touch control response;

meanwhile, since the lamination number of touch panel is effectively reduced, the thickness of the product can be effectively reduced while achieving flexible display touch control, and the production cost of the product is also reduced.

BRIEF DESCRIPTION OF THE DRAWINGS

In order to more clearly illustrate the embodiments of the present invention or the prior art, the following figures will be described in the embodiments or the prior art are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
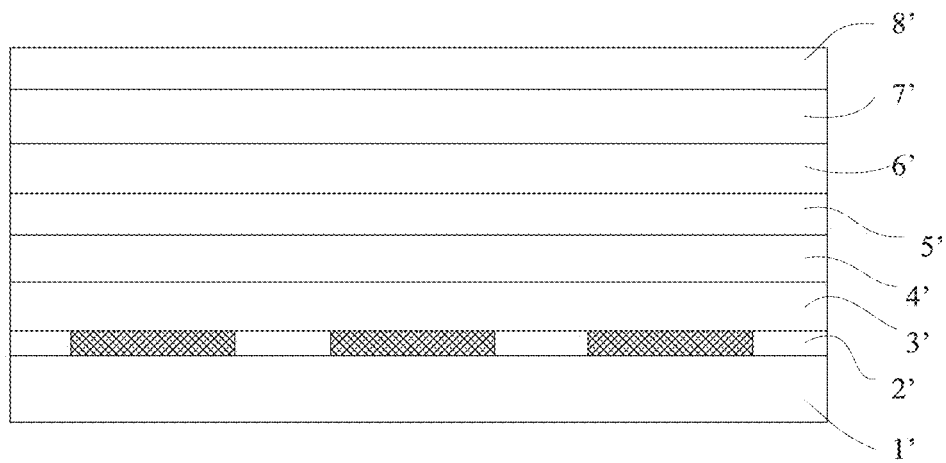
FIG. 1 is a structural diagram of an organic light emitting diode display panel using an external touch film bonding solution in the prior art.
Figure 2:
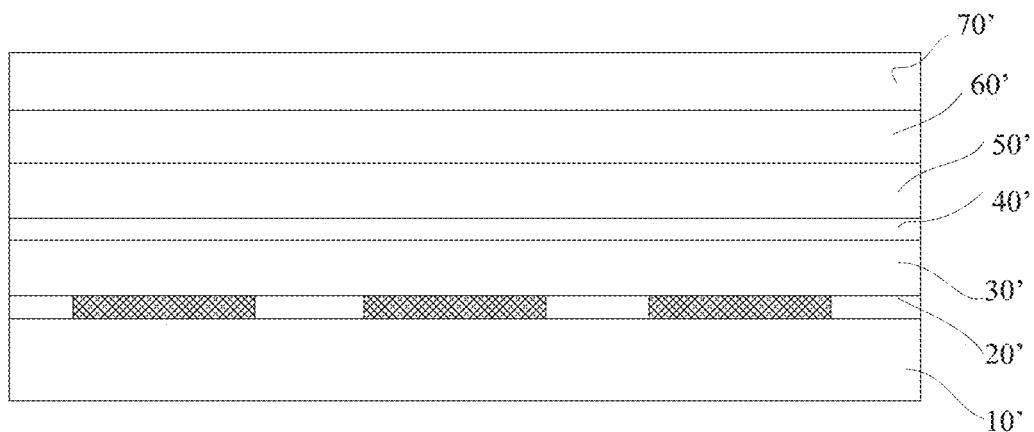
FIG. 2 is a structural diagram of an organic light emitting diode display panel using a glass package On-Cell touch technology in the prior art.

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Here, it should also be noted that, in order to avoid obscuring the present invention due to unnecessary details, only the structures and/or processing steps closely related to the solution according to the present invention are shown in the drawings, and other details that are not relevant to the present invention are omitted.

Figure 3:
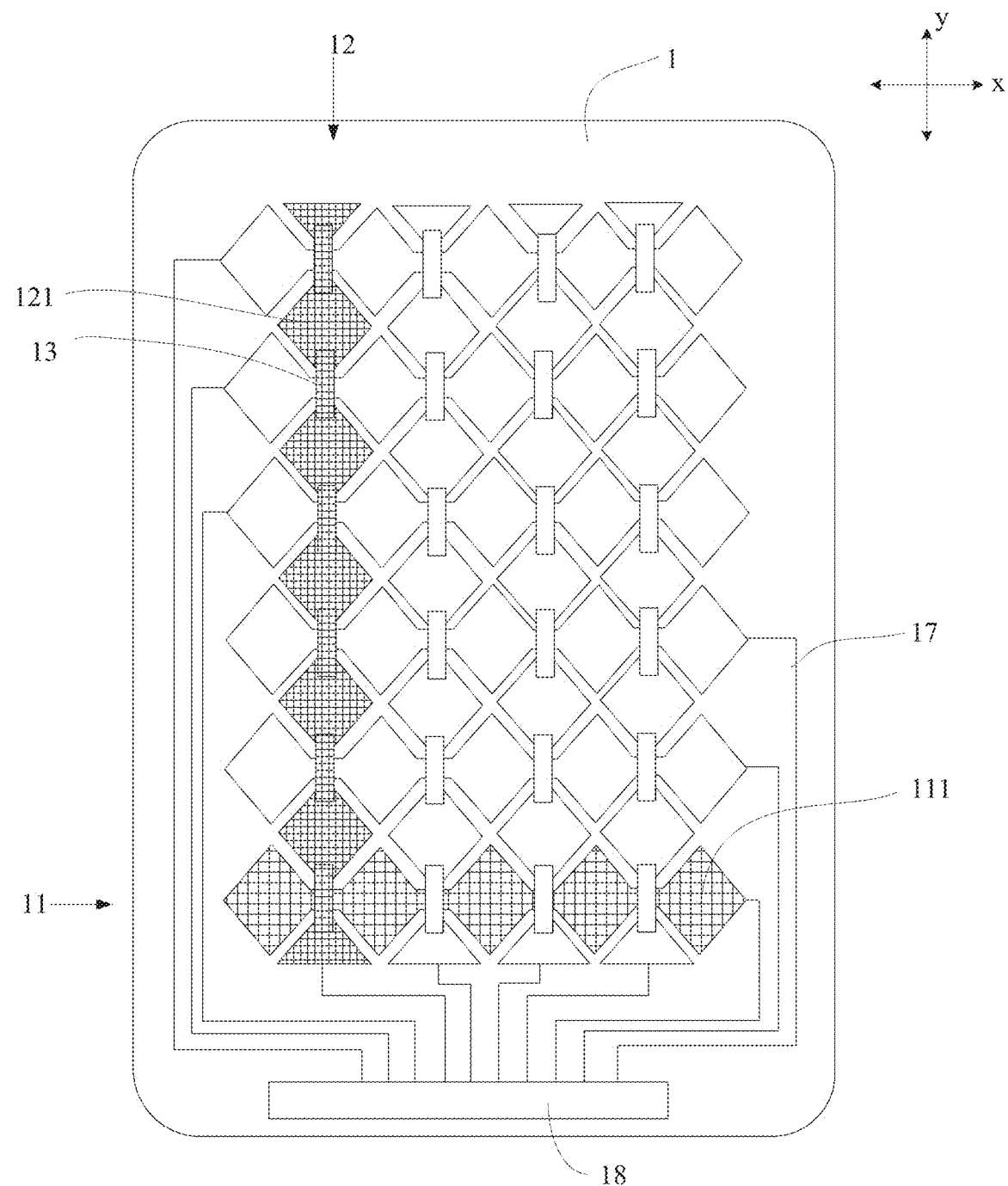
FIG. 3 is a structural diagram of one embodiment of a touch panel according to the present invention.
Figure 4:
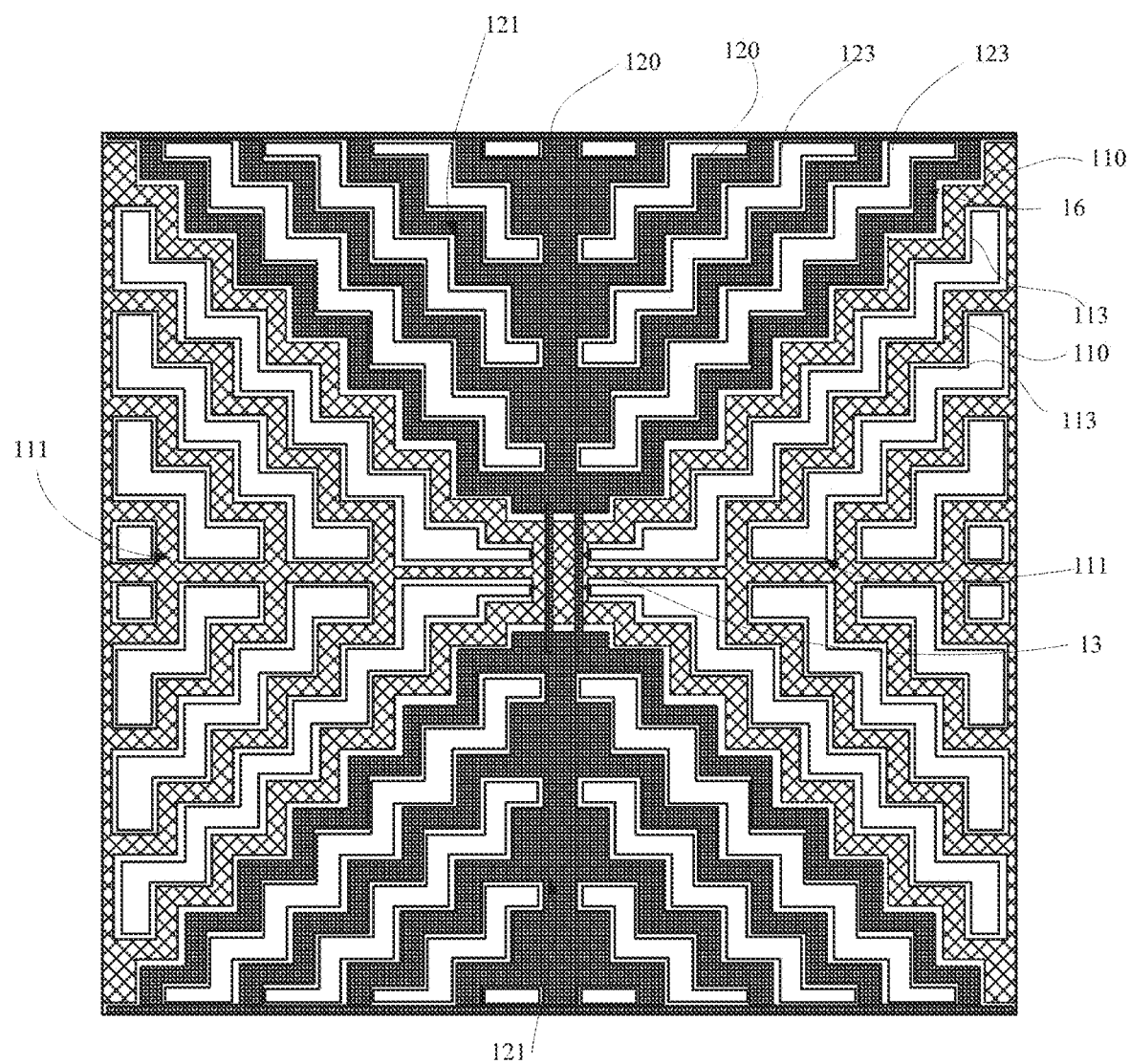
FIG. 4 is a structural diagram of one embodiment of an intersection of a first touch electrode string and a second touch electrode string in FIG. 3 with more details.
Figure 5:
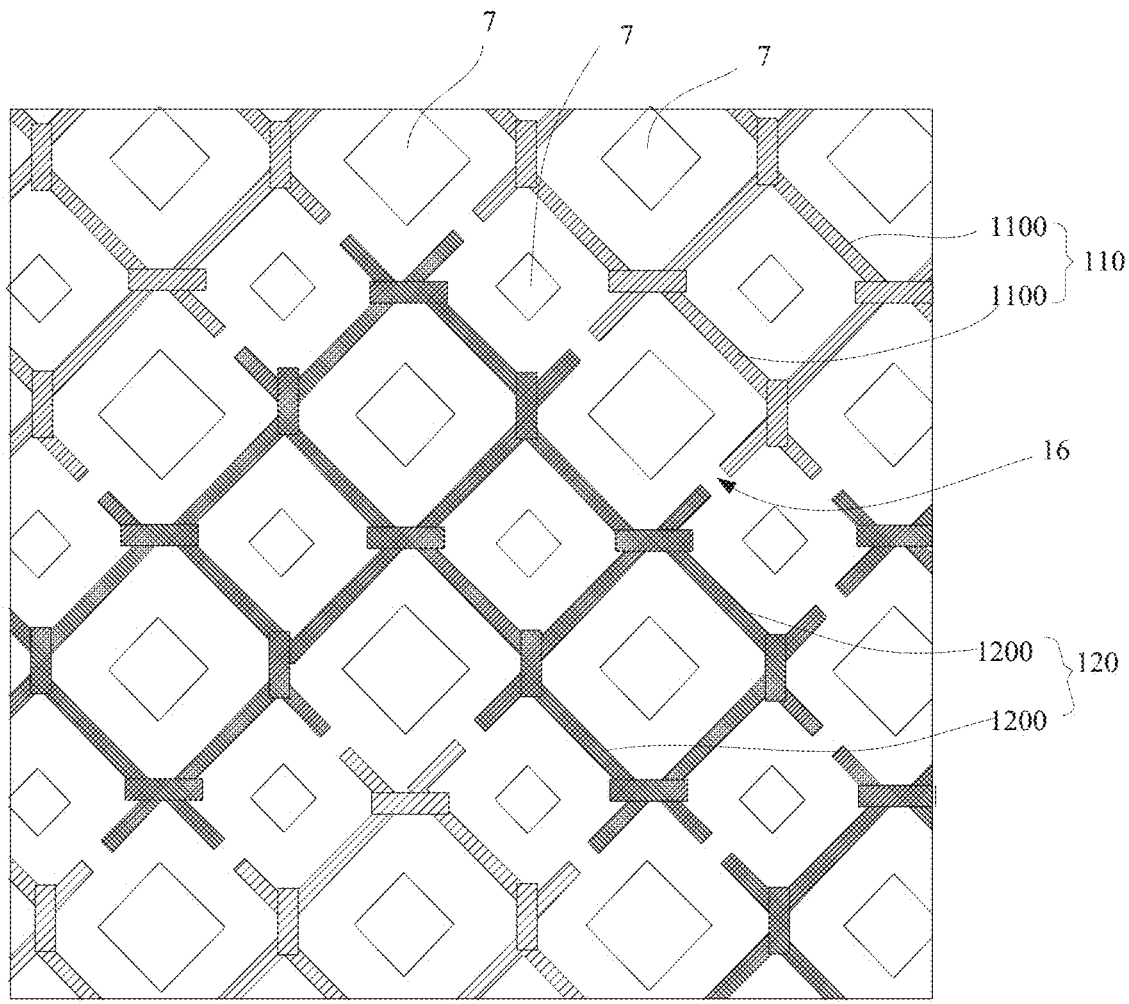
FIG. 5 is a structural diagram of an adjacent area of the first touch electrode string and the second touch electrode string in FIG. 4 with more details.

FIG. 3 shows a structural diagram of one embodiment of a touch panel according to the present invention. As shown in FIG. 4 to FIG. 5, in this embodiment, the touch panel 1 includes:

a plurality of first touch electrode strings 11 arranged in a first direction (such as X direction), wherein each first touch electrode string 11 in the plurality of first touch electrode strings includes a plurality of first grid electrodes 111, and adjacent first grid electrodes 111 are electrically connected; each of first grid electrodes 111 at least includes a plurality of first metal grid bars 110 spaced and connected, and in FIG. 3, the plurality of first metal grid bars 110 form a tree-like structure, that is, a plurality of branches are extended in the trunk, and a first floating electrode 113 is disposed between adjacent two first metal grid bars 110, and the first metal line 1100 in the first metal grid bar 110 is traced along the middle of adjacent pixel points 7 to not block a light-emitting area of the pixel points 7;

a plurality of second touch electrode strings 12 in a same layer that intersect with the plurality of first touch electrode strings 11 arranged in a second direction (such as Y direction), wherein each of the second touch electrode strings 12 includes a plurality of second grid electrodes 121, and adjacent second grid electrodes 121 are electrically connected with the metal bridge 13 in a lower layer, and in one illustration, the metal bridge 13 may be a metal grid bridge; each of the second grid electrodes 121 includes a plurality of second metal grid bars 120 spaced and connected, and a second floating electrode 123 is disposed between adjacent two second metal grid bars 120; the second metal line 1200 in the second metal grid bar 120 is traced along the middle of adjacent pixel points 7; in FIG. 3, for convenience to view, the view angle is the top view angle of the metal grid touch panel, and thus the metal bridge 13 is at the upmost layer, and the view angles of FIG. 4 to FIG. 7 in the following are similar; and an insulating layer, disposed between a metal bridge 13 and the first grid electrode 111, the second grid electrode 121 to insulate the plurality of first touch electrode strings 11 and the plurality of second touch electrode strings 12;

Adjacent edges of the first grid electrode 111 and the second grid electrode 121 are staggered, and electrical separations between the first metal grid bar 110 and the adjacent second metal grid bar 120, between the first metal grid bar 110 and the adjacent first floating electrode 113 and between the second metal grid bar 120 and the adjacent second floating electrode 123 are achieved by slight breaks 16 therebetween to specifically achieve the electrical separation between the first touch electrode string 11 and the second touch electrode string 12, the electrical separation between the first metal grid bar 110 and the first floating electrode 113 and the electrical separation between the second metal grid bar 120 and the second floating electrode 123; in some embodiments, a distance of the slight breaks 16 is within a range of 3 μm to 20 μm.

Two ends of the metal bridge 13 are electrically connected to second metal grid bars 120 in two adjacent second grid electrodes 121 with the through holes provided in the insulating layer. In general, a diameter of the through hole does not exceed a distance of adjacent pixel points. For instance, in some embodiments, the diameter of the through hole is less than 15 μm.

Each of the first touch electrode strings 11 and each of the second touch electrode strings 12 are connected with a trace 17 extending to a bonding area 18 of the touch panel; it can be understood that numbers of the first grid electrode 111 and the second grid electrode 121 in FIG. 3 are merely illustrative but not limited thereto.

As shown in FIG. 4, staggered edges of each first touch electrode string 11 and each second touch electrode string 12 possess a zigzag edge; it can be understood that in other embodiments, different staggered manners can be used, for instance, a pulsed edge. Such staggered manner can increase a contact area between the first grid electrode 111 and the second grid electrode 121 to enhance a mutual capacitance signal. It can be understood that the first floating electrode 113 and the second floating electrode 123 are respectively disposed in the first grid electrode 111 and the second grid electrode 121, which can effectively control a capacitance value and can shield other noise capacitance signals;

meanwhile, the shape difference of the grids in the first metal grid bar 110 and the second metal grid bar 120 shown in FIG. 4 is only for convenience of distinction, and is not limited. In the actual product, the same grid shape can be adopted in the two, which can be specifically referred to the embodiment in FIG. 5.

Figure 8:
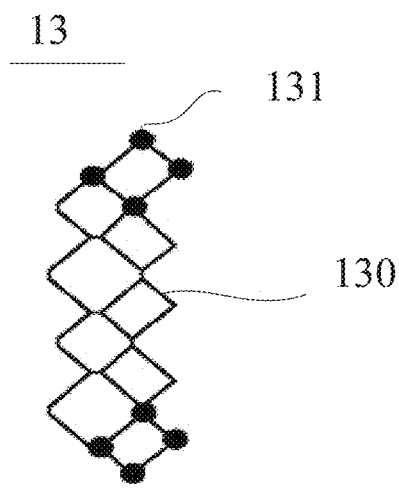
FIG. 8 is a structural diagram of one embodiment of a metal grid bridge in FIG. 3.

It can be understood that in other embodiments of the present invention, the metal bridge 13 is a metal grid bridge. The metal grid bridge includes at least one third metal line 130 which is electrically connected. A connecting portion is formed on the third metal line 130. Specifically, other different shapes also may be adopted. The metal bridge shown in FIG. 8 is an overall linear (bar) metal grid bridge formed by a plurality of (e.g., three third metal lines) third metal lines 130. The black dot 131 is a connecting portion electrically connected to the second touch electrode string 12 with the through hole. In order to improve the connection effect, the connecting portions generally are thicker than the adjacent third metal lines. It can be understood that the impedance of the metal grid bridge can be effectively reduced by using the plurality of third metal lines 130. In other embodiments, a X-shaped metal grid bridge and a double X-shaped metal grid bridge as a whole formed by a plurality of third metal lines 130 also can be adopted. Meanwhile, it can be understood that, the metal bridge 13 for connecting the adjacent second grid electrodes 121 is not limited to one. In other embodiments, the metal bridges 13 of other shapes or other numbers may be used. For instance, two or more may also be used. As shown in FIG. 4, two metal bridges 13 are used. Meanwhile, the third metal lines 130 are traced along a middle of adjacent pixel points 7.

The first touch electrode string 11 is one of a driving electrode and a sensing electrode, and the second touch electrode string 12 is an other of the driving electrode and the sensing electrode. The driving electrode is used for inputting a driving signal, and the sensing electrode is for receiving a detecting signal. As performing touch detection, a mutual capacitance change at the intersection of the two conductive lines or a self-capacitance change of each conductive line are detected, that is, a self-capacitance or a mutual capacitance are employed to get a location of the touch point. If the coordinate system is established in the first direction X and the second direction Y, the obtained touch point position can be represented by the coordinate system. Generally, the first direction X and the second direction Y are generally defined as being perpendicular to each other. In order to make capacitance detection easier, a coordinate positioning is also more convenient. When the touch screen 1 is in another form (circular, irregular shape, or curved shape), the first direction X and the second direction Y may also be set to be non-perpendicularly intersected.

In more specific illustrations, the first metal grid bar 110 and the second metal grid bar 120 are made of titanium aluminum titanium three-layer composite metal, and the metal bridge 13 is made of titanium aluminum titanium three-layer composite metal or molybdenum aluminum molybdenum three-layer composite metal. The use of this three-layer structure cannot only prevent metal oxidation, but also can enhance the folding resistance of the touch sensing line.

In one embodiment, widths of the first metal line 1100 in the first metal grid bar 110, the second metal line 1200 in the second metal grid bar 120 and the third metal line 130 in the metal bridge 13 are within a range of 0.5 μm to 5 μm.

Figure 6:
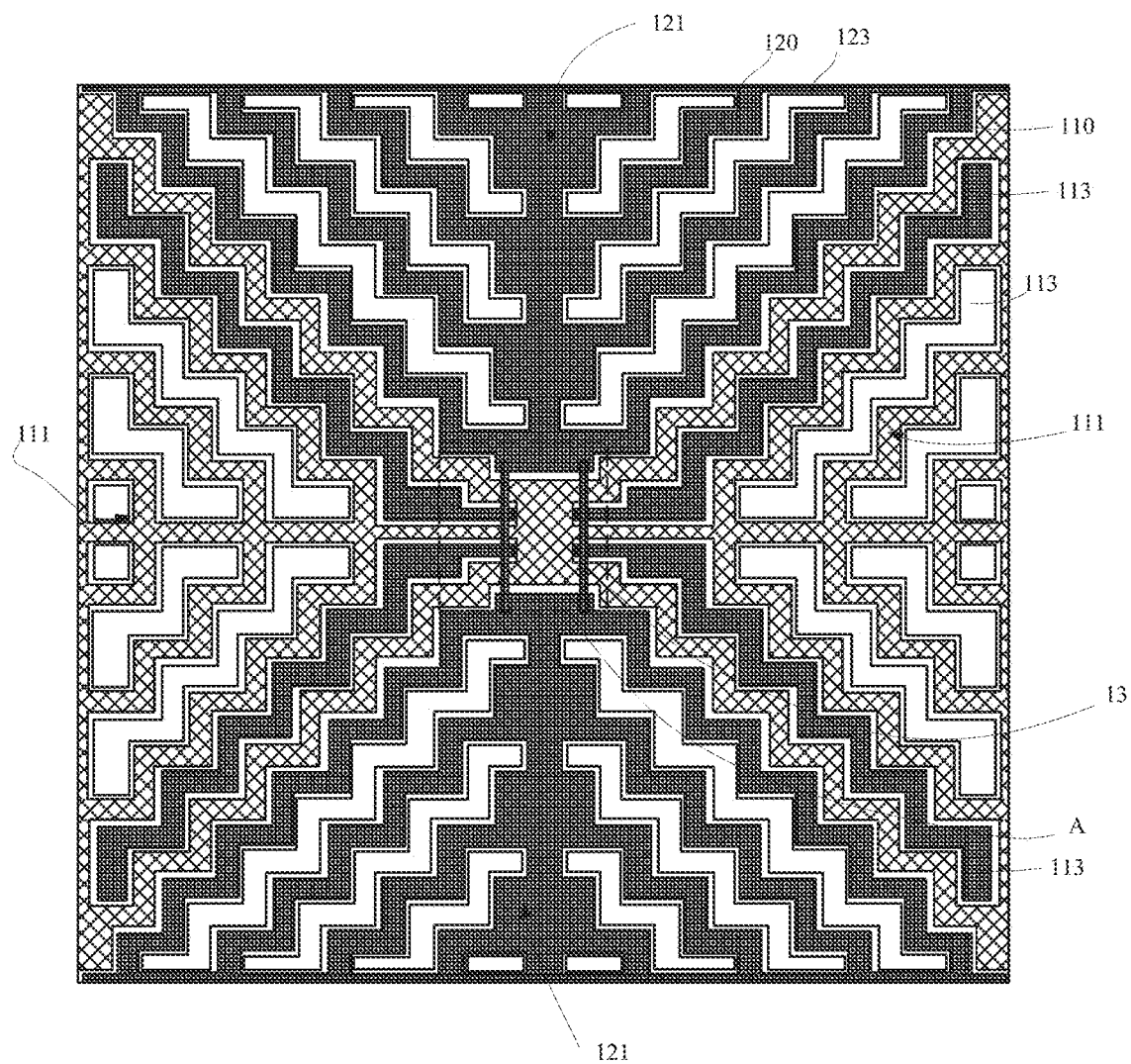
FIG. 6 is a structural diagram of another embodiment of an intersection of the first touch electrode string and the second touch electrode string in FIG. 3 with more details.
Figure 7:
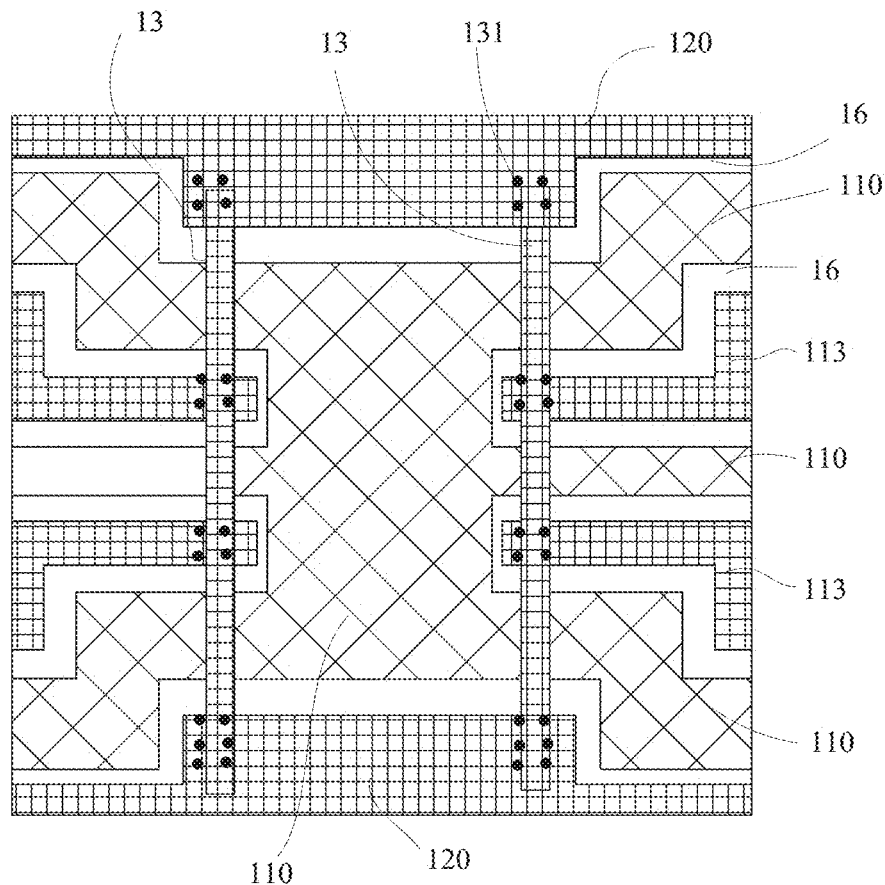
FIG. 7 is an enlarged diagram of a portion A in FIG. 6.

FIG. 6 is a structural diagram of another embodiment of an intersection of the first touch electrode string and the second touch electrode string in FIG. 3 with more details. Please also refer to the enlarged diagram in FIG. 7. In this embodiment, the difference from the embodiment shown in FIG. 4 is that the metal bridge 13 is further connected to the first floating electrode 113 of the first grid electrode 111 adjacent to the second grid electrode 121 with a through hole disposed in the insulating layer. Accordingly, the outermost floating electrode 113 of the first grid electrode 111 becomes a part of the second grid electrode 121, thereby increasing the contact area between the first grid electrode 111 and the second grid electrode 121, which can effectively enhance the mutual capacitance signal to reduce the influence of the interference signal and to improve the sensitivity of the touch response.

Figure 9:
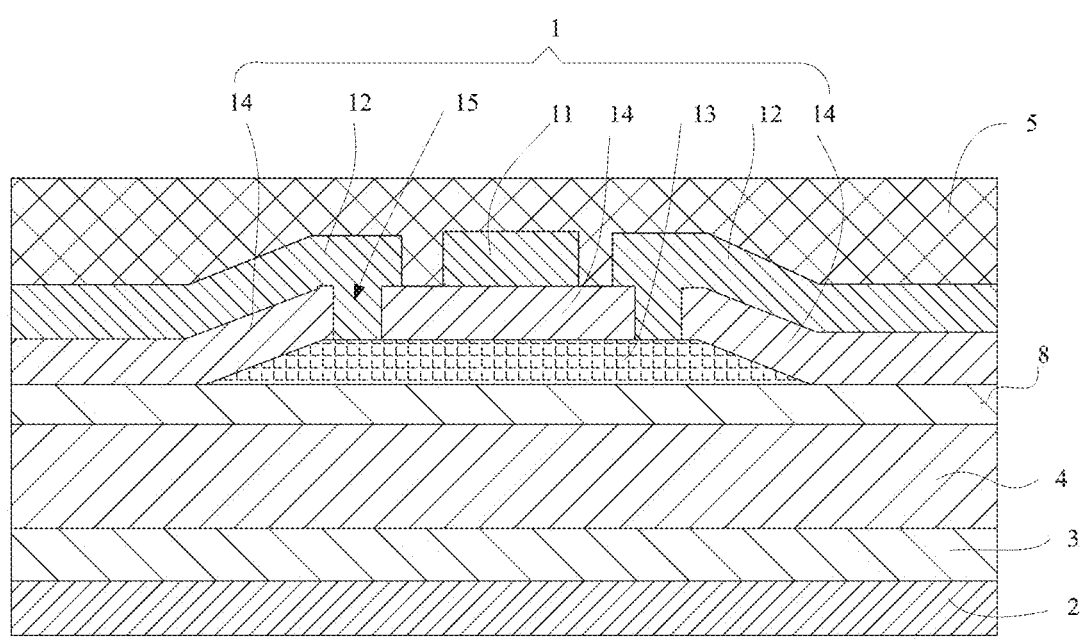
FIG. 9 is a structural diagram of one embodiment of an organic light emitting diode display panel according to the present invention.

Correspondingly, the present invention also provides an organic light emitting diode display panel as shown in FIG. 9. The organic light emitting diode display panel comprises:

a substrate 2, an organic light emitting diode layer 3 disposed on the substrate 2 and an encapsulation layer 4 disposed above the organic light emitting diode layer 3; and a substrate layer 8 disposed on the encapsulation layer 4, wherein the substrate layer 8 can be made of a silicon nitride material;

a touch panel 1 disposed on the substrate layer 8;

a protective layer 5 disposed on the touch panel 1.

More specifically, the touch panel 1 includes:

a first metal layer, forming a metal bridge 13;

an insulating layer 14 is disposed on the first metal layer;

through holes 15 are formed in the insulating layer at positions of two ends of the metal bridge 13;

a second metal layer is deposited on the insulating layer 14 and an encapsulation layer 4 and is etched for patterning to form the plurality of first touch electrode strings 11 and the plurality of second touch electrode strings 12, which are mutually intersected, wherein the adjacent second grid electrodes 121 in the second touch electrode strings 12 are electrically connected with the connecting bridge 13 with the aforesaid through hole 15.

For more details of the touch panel 1, referring to the foregoing descriptions of FIG. 3 to FIG. 8, and no further details are provided herein.

It can be understood that in the present invention, a metal grid touch sensing line is fabricated on the encapsulation layer of the flexible organic light emitting diode display panel, and the metal grid line is not positioned in the light emitting area of the pixel point, and is traced in the middle of the adjacent pixel points. At least one electrode of the driving electrode and the sensing electrode is connected and conducted with the metal bridge (bridging metal) thereunder, to realize a flexible touch panel and to reduce the thickness of the film by reducing the use of transparent optical adhesive.

The embodiment of the present invention has benefits below:

the touch panel and the organic light emitting diode display panel provided by the present invention can realize the On-Cell touch scheme of the flexible display touch control by forming the metal grid touch sensing line on the thin film encapsulation layer of the flexible organic light emitting diode display panel;

moreover, since the metal grid is used as the touch sensing circuit, the product can possess good bending resistance characteristics, and the metal grid lines are traced in the middle of adjacent pixel points, thereby minimizing the optical influence of the touch sensor on the organic light emitting diode;

meanwhile, a structure of the metal grid bar and the floating electrode is used in both the first touch electrode and the second touch electrode, and in the meantime, the floating electrodes at the edges in the second touch electrode and the first touch electrode are connected with the metal bridge, which can increase a contact area between the first touch electrode and the second touch electrode to enhance a mutual capacitance signal for effectively reducing the influence of the interference signal and improving the sensitivity of the touch control response;

meanwhile, since the lamination number of touch panel is effectively reduced, the thickness of the product can be effectively reduced while achieving flexible display touch control, and the production cost of the product is also reduced.

Incidentally, herein, relational terms such as first and second and the like are only used to distinguish one entity or operation from another entity or operation separate, without necessarily requiring or implying these entities or operations of between the presence of any such actual relationship or order. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A touch panel, comprising:
   a plurality of first touch electrode strings arranged in a first direction, wherein each of the first touch electrode strings comprises a plurality of first grid electrodes which are electrically connected; each of the first grid electrodes at least comprises a plurality of first metal grid bars spaced and connected, and a first floating electrode is disposed between adjacent two first metal grid bars;
a plurality of second touch electrode strings in a same layer that intersect with the plurality of first touch electrode strings arranged in a second direction, wherein each of the second touch electrode strings comprises a plurality of second grid electrodes; each of the second grid electrodes comprises a plurality of second metal grid bars spaced and connected, and a second floating electrode is disposed between adjacent two second metal grid bars;
an insulating layer, disposed between a metal bridge and the first grid electrode, the second grid electrode to insulate the plurality of first touch electrode strings and the plurality of second touch electrode strings;
wherein adjacent edges of the first grid electrode and the second grid electrode are staggered, and electrical separations between the first metal grid bar and the adjacent second metal grid bar, between the first metal grid bar and the adjacent first floating electrode and between the second metal grid bar and the adjacent second floating electrode are achieved by slight breaks therebetween.

2. The touch panel according to claim 1, wherein two ends of the metal bridge are connected with two adjacent second grid electrodes with through holes provided in the insulating layer.

3. The touch panel according to claim 2, wherein the metal bridge further connects the second grid electrode and the first floating electrode of the first grid electrode adjacent to the second grid electrode with a through hole disposed in the insulating layer.

4. The touch panel according to claim 3, wherein staggered edges of the first touch electrode string and the second touch electrode string possess a pulsed edge or a zigzag edge.

5. The touch panel according to claim 4, wherein the first metal grid bar and the second metal grid bar are made of titanium aluminum titanium three-layer composite metal, and the metal bridge is made of titanium aluminum titanium three-layer composite metal or molybdenum aluminum molybdenum three-layer composite metal.

6. The touch panel according to claim 5, wherein the metal bridge is a metal grid bridge, and the metal bridge comprises at least one third metal line, which is electrically connected, and the metal bridge formed by the third metal line is linear, X-shaped or double X-shaped as a whole.

7. The touch panel according to claim 6, wherein the first touch electrode string is one of a driving electrode and a sensing electrode, and the second touch electrode string is an other of the driving electrode and the sensing electrode.

8. The touch panel according to claim 6, wherein widths of the first metal grid bar, the second metal grid bar and the third metal line in the metal bridge are within a range of 0.5 µm to 5 µm.

9. The touch panel according to claim 6, wherein a diameter of the through hole does not exceed a distance of adjacent pixel points; and a distance of the slight breaks is within a range of 3 µm to 20 µm.

10. An organic light emitting diode display panel, which comprises a substrate, an organic light emitting diode layer disposed on the substrate and an encapsulation layer disposed above the organic light emitting diode layer, further comprising:

a substrate layer disposed on the encapsulation layer;
a touch panel disposed on the substrate layer;
a protective layer disposed on the touch panel;
wherein the touch panel comprises:
a plurality of first touch electrode strings arranged in a first direction, wherein each of the first touch electrode strings comprises a plurality of first grid electrodes which are electrically connected; each of the first grid electrodes at least comprises a plurality of first metal grid bars spaced and connected, and a first floating electrode is disposed between adjacent two first metal grid bars;
a plurality of second touch electrode strings in a same layer that intersect with the plurality of first touch electrode strings arranged in a second direction, wherein each of the second touch electrode strings comprises a plurality of second grid electrodes; each of the second grid electrodes comprises a plurality of second metal grid bars spaced and connected, and a second floating electrode is disposed between adjacent two second metal grid bars;
an insulating layer, disposed between a metal bridge and the first grid electrode, the second grid electrode to insulate the plurality of first touch electrode strings and the plurality of second touch electrode strings;
wherein adjacent edges of the first grid electrode and the second grid electrode are staggered, and electrical separations between the first metal grid bar and the adjacent second metal grid bar, between the first metal grid bar and the adjacent first floating electrode and between the second metal grid bar and the adjacent second floating electrode are achieved by slight breaks therebetween.

11. The organic light emitting diode display panel according to claim 10, wherein two ends of the metal bridge are connected with two adjacent second grid electrodes with through holes provided in the insulating layer.

12. The organic light emitting diode display panel according to claim 11, wherein the metal bridge further connects the second grid electrode and the first floating electrode of the first grid electrode adjacent to the second grid electrode with a through hole disposed in the insulating layer.

13. The organic light emitting diode display panel according to claim 12, wherein staggered edges of the first touch electrode string and the second touch electrode string possess a pulsed edge or a zigzag edge.

14. The organic light emitting diode display panel according to claim 13, wherein the first metal grid bar and the second metal grid bar are made of titanium aluminum titanium three-layer composite metal, and the metal bridge is made of titanium aluminum titanium three-layer composite metal or molybdenum aluminum molybdenum three-layer composite metal.

15. The organic light emitting diode display panel according to claim 14, wherein the metal bridge is a metal grid bridge, and the metal bridge comprises at least one third metal line, which is electrically connected, and the metal bridge formed by the third metal line is linear, X-shaped or double X-shaped as a whole.

16. The organic light emitting diode display panel according to claim 15, wherein the first touch electrode string is one of a driving electrode and a sensing electrode, and the second touch electrode string is an other of the driving electrode and the sensing electrode.

17. The organic light emitting diode display panel according to claim 15, wherein widths of the first metal grid bar, the second metal grid bar and the third metal line in the metal bridge are within a range of 0.5 μm to 5 μm.

18. The organic light emitting diode display panel according to claim 15, wherein a diameter of the through hole does not exceed a distance of adjacent pixel points; and a distance of the slight breaks is within a range of 3 μm to 20 μm.

\* \* \* \* \*